United States Patent
Oka

(10) Patent No.: US 12,278,126 B2
(45) Date of Patent: Apr. 15, 2025

(54) PLASMA PROCESSING APPARATUS, THERMAL RESISTANCE ACQUISITION METHOD, AND THERMAL RESISTANCE ACQUISITION PROGRAM

(71) Applicant: Tokyo Electron Limited, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 247 days.

(21) Appl. No.: 17/467,880

(22) Filed: Sep. 7, 2021

(65) Prior Publication Data

US 2022/0084850 A1   Mar. 17, 2022

(30) Foreign Application Priority Data

Sep. 14, 2020   (JP) ................. 2020-153980

(51) Int. Cl.
*H01L 21/67* (2006.01)
*H01L 21/3065* (2006.01)
*H01L 21/683* (2006.01)

(52) U.S. Cl.
CPC .... *H01L 21/67248* (2013.01); *H01L 21/3065* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 10,892,144 B2* | 1/2021 | Oka | ................ | H01L 21/67253 |
| 11,546,970 B2* | 1/2023 | Oka | ................ | H01J 37/32724 |
| 11,557,468 B2* | 1/2023 | Oka | ................ | H01L 21/67103 |
| 2002/0068371 A1* | 6/2002 | Yun | ................ | H01L 22/26 |
| | | | | 374/E7.042 |
| 2019/0148120 A1* | 5/2019 | Oka | ................ | H01L 21/67103 |
| | | | | 219/468.1 |
| 2022/0084850 A1* | 3/2022 | Oka | ................ | H01L 21/67103 |
| 2022/0415628 A1* | 12/2022 | Ezaki | ................ | H01J 37/32642 |
| 2023/0087979 A1* | 3/2023 | Oka | ................ | H01L 21/6831 |
| | | | | 219/468.1 |
| 2023/0105165 A1* | 4/2023 | Oka | ................ | H01L 21/67248 |
| | | | | 219/444.1 |

FOREIGN PATENT DOCUMENTS

JP   2016001688 A   1/2016

* cited by examiner

*Primary Examiner* — Parviz Hassanzadeh
*Assistant Examiner* — Tiffany Z Nuckols
(74) *Attorney, Agent, or Firm* — Nath, Goldberg & Meyer; Jerald L. Meyer; Tanya E. Harkins

(57) ABSTRACT

A plasma processing apparatus includes: a substrate support on which a substrate is supported; a detector configured to detect a temperature of the substrate support; a measurement unit configured to measure, by the detector, a temperature change of the substrate support while the temperature of the substrate support is increasing after igniting plasma or while the temperature of the substrate support is decreasing after the plasma processing is completed and the plasma is extinguished, based on the temperature of the substrate support detected by the detector; and an acquisition unit configured to acquire a thermal resistance between the substrate and the substrate support based on the temperature change of the substrate support measured by the measurement unit.

7 Claims, 8 Drawing Sheets

PLASMA PROCESSING APPARATUS, THERMAL RESISTANCE ACQUISITION METHOD, AND THERMAL RESISTANCE ACQUISITION PROGRAM

CROSS-REFERENCE TO RELATED APPLICATION

This application is based upon and claims the benefit of priority from Japanese Patent Application No. 2020-153980, filed on Sep. 14, 2020, the entire contents of which are incorporated herein by reference.

TECHNICAL FIELD

The present disclosure relates to a plasma processing apparatus, a thermal resistance acquisition method, and a thermal resistance acquisition program.

BACKGROUND

Patent Document 1 discloses a method in which a heater capable of temperature control is embedded in a substrate support for mounting a semiconductor wafer thereon and the temperature of the semiconductor wafer is controlled by the heater.

PRIOR ART DOCUMENT

Patent Document

Patent Document 1: Japanese Laid-Open Patent Publication No. 2016-001688

SUMMARY

According to one embodiment of the present disclosure, there is provided a plasma processing apparatus. The plasma processing apparatus includes: a substrate support on which a substrate is supported; a detector configured to detect a temperature of the substrate support; a measurement unit configured to measure, by the detector, a temperature change of the substrate support while the temperature of the substrate support is increasing after igniting plasma or while the temperature of the substrate support is decreasing after the plasma processing is completed and the plasma is extinguished, based on the temperature of the substrate support detected by the detector; and an acquisition unit configured to acquire a thermal resistance between the substrate and the substrate support based on the temperature change of the substrate support measured by the measurement unit.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a plasma processing apparatus, a thermal resistance acquisition method and a thermal resistance acquisition program disclosed herein will be described in detail with reference to the drawings. It should be noted that the present embodiments do not limit the plasma processing apparatus, the thermal resistance acquisition method and the thermal resistance acquisition program disclosed herein.

There is known a plasma processing apparatus that performs plasma processing such as plasma etching on a substrate such as a semiconductor wafer or the like. In plasma processing apparatus, the temperature of the substrate is an important parameter. In the plasma processing apparatus, it is difficult to directly measure the temperature of the substrate. Therefore, in the plasma processing apparatus, the temperature of a ceramic plate or an aluminum base constituting a substrate support for mounting the substrate thereon is measured to estimate whether or not the temperature of the substrate is changed.

However, the temperature of the substrate may have a large error from the estimated temperature due to the influence of the change in the surface state of the substrate support. Therefore, the state of the plasma-processed substrate is periodically investigated to confirm whether or not the temperature of the substrate is changed over time. The change in the surface state of the substrate support appears as a change in the thermal resistance between the substrate and the substrate support.

Therefore, a technique for acquiring the thermal resistance between the substrate and the substrate support is expected.

First Embodiment

[Apparatus Configuration]

Figure 1:
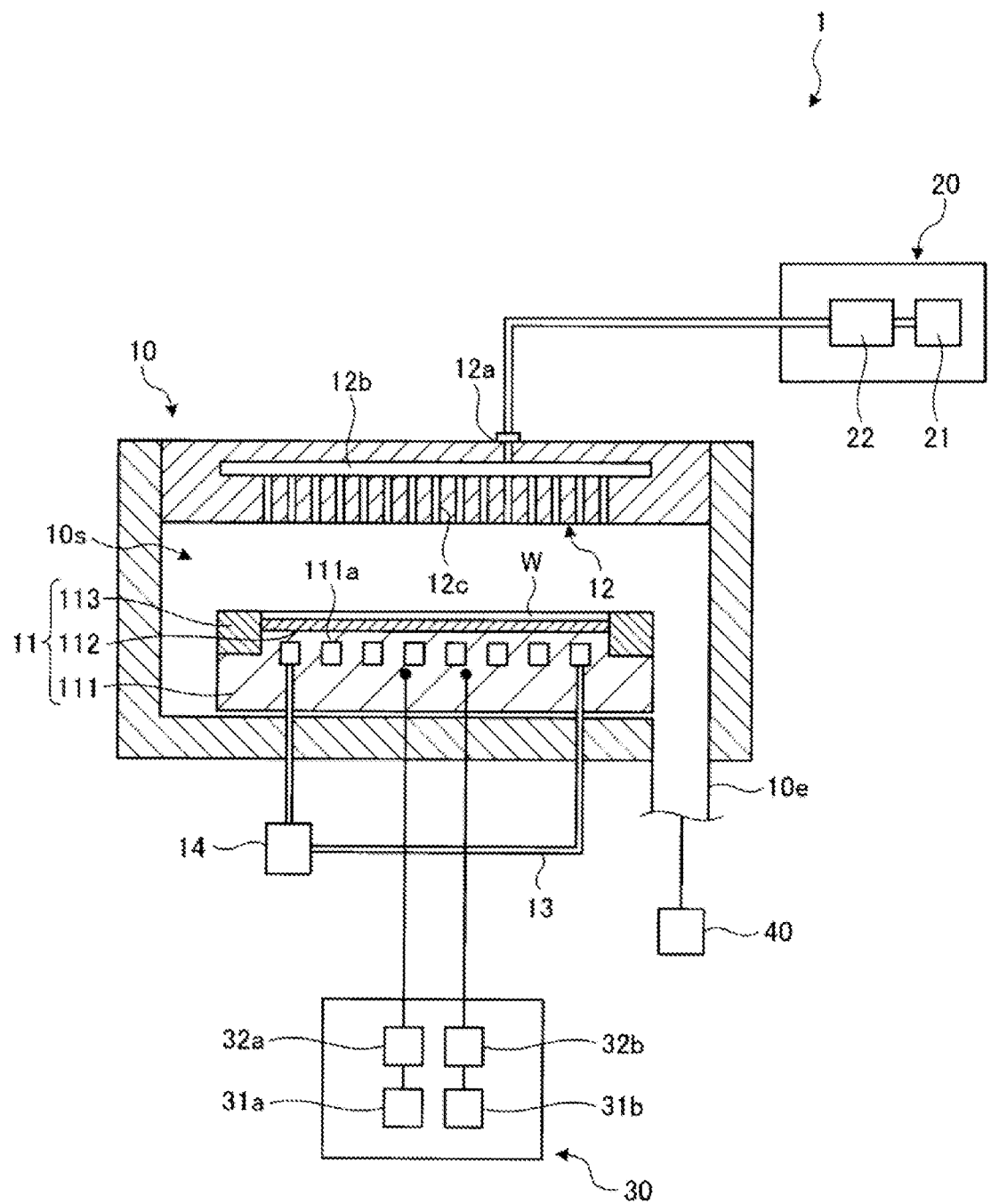
FIG. 1 is a schematic sectional view showing an example of a plasma processing apparatus according to a first embodiment.

A first embodiment will be described. FIG. 1 is a schematic sectional view showing an example of a plasma processing apparatus 1 according to a first embodiment. In one embodiment, the plasma processing apparatus 1 includes a plasma processing chamber 10, a gas supplier 20, an RF (Radio Frequency) power supplier 30, and an exhaust system 40. Further, the plasma processing apparatus 1 includes a substrate support 11 and an upper electrode shower head 12. The substrate support 11 is arranged in a lower region of a plasma processing space 10s formed inside the plasma processing chamber 10. The upper electrode shower head 12 is located above the substrate support 11 and may function as a portion of the ceiling of the plasma processing chamber 10. In addition, the plasma processing apparatus 1 further includes a controller 100.

The substrate support 11 is configured to support a substrate W such as a semiconductor wafer or the like in the plasma processing space 10s. In one embodiment, the substrate support 11 includes a lower electrode 111, an electrostatic chuck 112 and an edge ring 113. The electrostatic chuck 112 is arranged on the lower electrode 111 and is configured to support the substrate W on the upper surface of the electrostatic chuck 112. The edge ring 113 is arranged so as to surround the substrate W on the upper surface of the peripheral edge portion of the lower electrode 111. The lower electrode 111 is made of a conductive metal such as aluminum or the like. The lower electrode 111 functions as a base for supporting the electrostatic chuck 112 and the edge ring 113. The substrate support 11 may include a temperature adjustment module configured to adjust the temperature of at least one of the electrostatic chuck 112 and the substrate W to a target temperature. The temperature adjustment module may include a heater, a flow path, or a combination thereof. For example, the lower electrode 111 is formed with a flow path 111a for allowing a temperature adjustment medium to flow therethrough. The flow path 111a is formed on the entire surface of a mounting region in a corresponding relationship with the mounting region on which the substrate W is mounted. A temperature adjustment medium such as a refrigerant or a heat medium flows through the flow path 111a. For example, the flow path 111a is connected to a chiller unit 14 via a pipe 13. The chiller unit 14 is capable of controlling the temperature of the supplied refrigerant. The plasma processing apparatus 1 has a configuration in which the temperature of the substrate support 11 can be controlled by circulating a temperature-controlled refrigerant (e.g., cooling water) from the chiller unit 14 to the flow path 111a. The plasma processing apparatus 1 may have a configuration in which the temperature of the substrate W and the edge ring 113 can be controlled by supplying a heat transfer gas to the rear surface of the substrate W or the edge ring 113. For example, a gas supply pipe for supplying a heat transfer gas (backside gas) such as a helium gas or the like may be provided on the rear surface of the substrate W so as to penetrate the substrate support 11 or the like. The gas supply pipe is connected to a gas supply source. With these configurations, the temperature of the substrate W attracted to and held by the electrostatic chuck 112 on the upper surface of the substrate support 11 is controlled to a predetermined temperature.

Further, the substrate support 11 is provided with a temperature sensor (not shown) capable of detecting a temperature. The temperature sensor detects the temperature of the substrate support 11. The temperature sensor may be a contact type sensor such as a thermocouple or the like, or a non-contact type sensor such as a radiation thermometer or the like. The temperature sensor outputs the detected temperature data to the controller 100.

The upper electrode shower head 12 is configured to supply one or more processing gases from the gas supplier 20 to the plasma processing space 10s. In one embodiment, the upper electrode shower head 12 has a gas inlet 12a, a gas diffusion chamber 12b and a plurality of gas outlets 12c. The gas inlet 12a is in fluid communication with the gas supplier 20 and the gas diffusion chamber 12b. The plurality of gas outlets 12c is in fluid communication with the gas diffusion chamber 12b and the plasma processing space 10s. In one embodiment, the upper electrode shower head 12 is configured to supply one or more processing gases from the gas inlet 12a to the plasma processing space 10s via the gas diffusion chamber 12b and the plurality of gas outlets 12c.

The gas supplier 20 may include one or more gas sources 21 and one or more flow rate controller 22. In one embodiment, the gas supplier 20 is configured to supply one or more processing gases from the corresponding gas sources 21 to the gas inlet 12a via the corresponding flow rate controllers 22. Each flow rate controller 22 may include, for example, a mass flow controller or a pressure-controlled flow rate controller. Further, the gas supplier 20 may include one or more flow rate modulation devices that modulate or pulse the flow rate of one or more processing gases.

The RF power supplier 30 supplies RF power, for example one or more RF signals, to the lower electrode 111, the upper electrode shower head 12, or one or more electrodes such as both the lower electrode 111 and the upper electrode shower head 12. As a result, plasma is generated from one or more processing gases supplied to the plasma processing space 10s. Therefore, the RF power supplier 30 can function as at least a portion of a plasma generator configured to generate plasma from one or more processing gases in the plasma processing chamber. In one embodiment, the RF power supplier 30 includes two RF generators 31a and 31b and two matching circuits 32a and 32b. In one embodiment, the RF power supplier 30 is configured to supply a first RF signal from the first RF generator 31a to the lower electrode 111 via the first matching circuit 32a. For example, the first RF signal may have frequency in the range of 27 MHz to 100 MHz.

Further, in one embodiment, the RF power supplier 30 is configured to supply a second RF signal from the second RF generator 31b to the lower electrode 111 via the second matching circuit 32b. For example, the second RF signal may have a frequency in the range of 400 kHz to 13.56 MHz. Alternatively, a DC (Direct Current) pulse generator may be used instead of the second RF generator 31b.

Although not shown, other embodiments may be considered in the present disclosure. For example, in an alternative embodiment, the RF power supplier 30 may be configured to supply a first RF signal from one RF generator to the lower electrode 111, supply a second RF signal from another RF generator to the lower electrode 111, and supply a third RF signal from yet another RF generator to the lower electrode 111. Moreover, in another alternative embodiment, a DC voltage may be applied to the upper electrode shower head 12.

Furthermore, in various embodiments, the amplitude of one or more RF signals (i.e., a first RF signal, a second RF signal, etc.) may be pulsed or modulated. The amplitude modulation may include pulsing the RF signal amplitude between the on and off states, or between two or more different on states.

The exhaust system 40 may be connected to, for example, an exhaust port 10e provided at the bottom of the plasma processing chamber 10. The exhaust system 40 may include a pressure valve and a vacuum pump. The vacuum pump may include a turbo molecular pump, a roughing pump or a combination thereof.

The operation of the plasma processing apparatus 1 configured as described above is generally controlled by a controller 100. The controller 100 is, for example, a computer and controls each part of the plasma processing apparatus 1. The operation of the plasma processing apparatus 1 is generally controlled by the controller 100. The controller 100 controls the plasma processing apparatus 1 to execute various steps described in the present disclosure.

[Controller Configuration]

Figure 2:
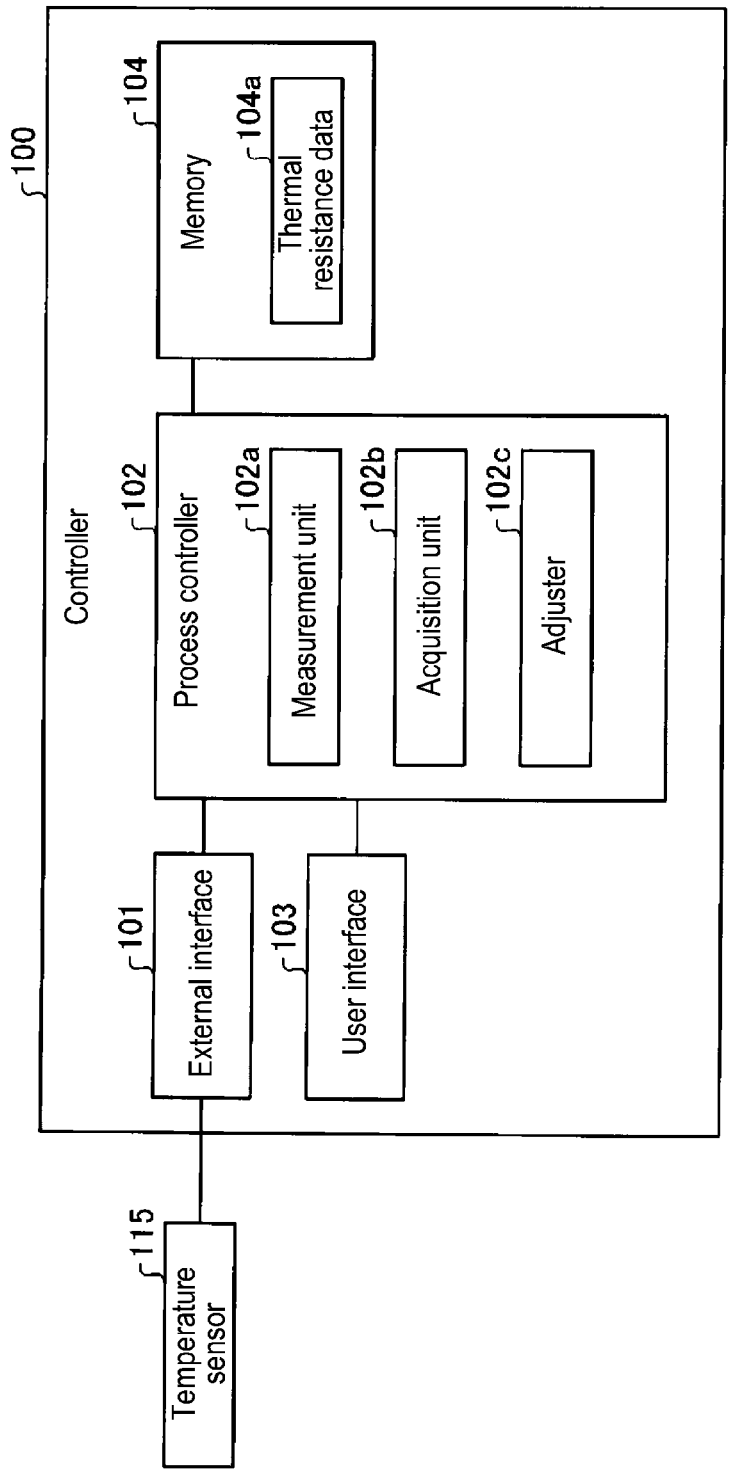
FIG. 2 is a block diagram showing a schematic configuration of a controller according to the first embodiment.

Next, the controller 100 will be described in detail. FIG. 2 is a block diagram showing a schematic configuration of the controller 100 according to the first embodiment. The controller 100 includes an external interface 101, a process controller 102, a user interface 103, and a memory 104.

The external interface 101 is capable of communicating with each part of the plasma processing apparatus 1, and is configured to input and output various data. For example, temperature data is inputted to the external interface 101 from a temperature sensor 115 provided on the substrate support 11.

The process controller 102 includes a CPU (Central Processing Unit) and controls each part of the plasma processing apparatus 1.

The user interface 103 includes a keyboard for a process manager to input commands for managing the plasma processing apparatus 1, a display for visualizing and displaying the operating status of the plasma processing apparatus 1, and the like.

The memory 104 stores a control program (software) for realizing various processes executed by the plasma processing apparatus 1 under the control of the process controller 102, and a recipe in which processing condition data and the like are stored. The control program or the recipe may be the one stored in a computer-readable computer recording medium (e.g., a hard disk, an optical disk such as a DVD or the like, a flexible disk, a semiconductor memory, etc.), or may be the one transmitted from another apparatus at any time via a dedicated line and used on an online basis.

The process controller 102 includes an internal memory for storing a program and data. The process controller 102 reads a control program stored in the memory 104 and executes the processing of the read control program. The process controller 102 functions as various processing parts when the control program is operated. For example, the process controller 102 has the functions of a measurement unit 102a, an acquisition unit 102b and an adjuster 102c. In the present embodiment, a case where the process controller 102 has the functions of the measurement unit 102a, the acquisition unit 102b and the adjuster 102c will be described by way of example. However, the functions of the measurement unit 102a, the acquisition unit 102b and the adjuster 102c may be distributed to and realized by a plurality of controllers.

Figure 3:
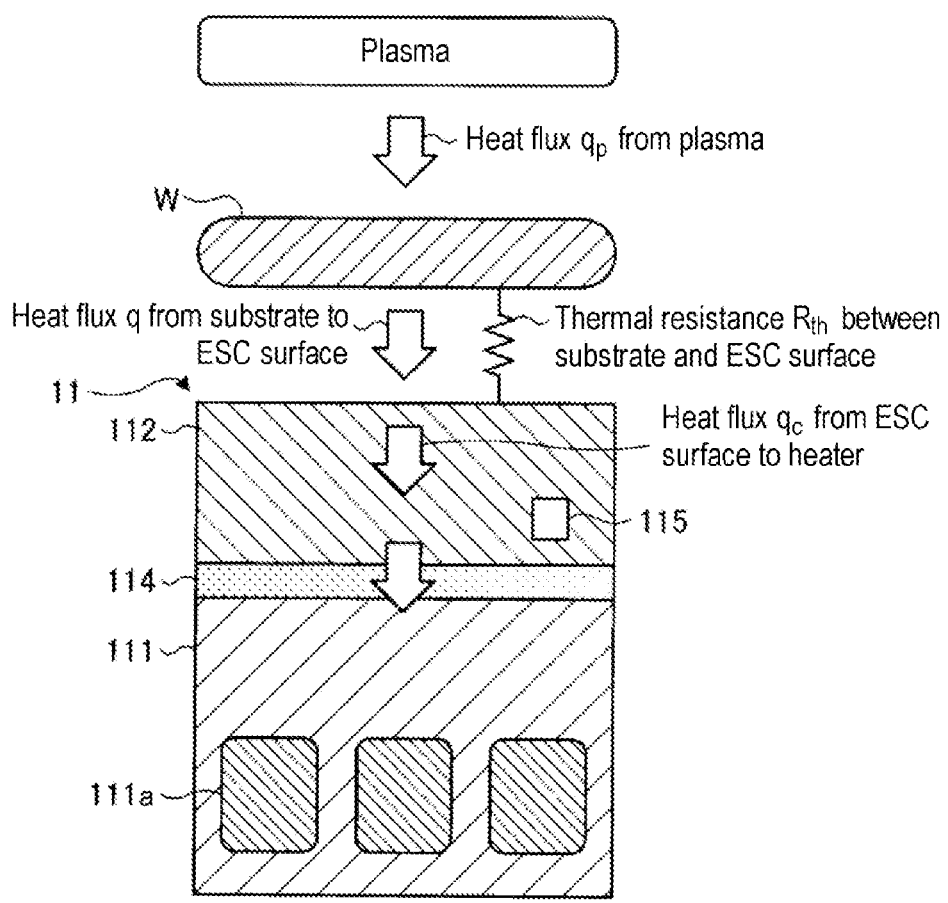
FIG. 3 is a diagram schematically showing a configuration of a substrate support according to the first embodiment.

The flow of energy that affects the temperature of the substrate W will be described. FIG. 3 is a diagram schematically showing the configuration of the substrate support 11 according to the first embodiment. In FIG. 3, the substrate W and the substrate support 11 are shown in a simplified manner The substrate support 11 includes an electrostatic chuck (ESC) 112 and a lower electrode 111. The electrostatic chuck 112 and the lower electrode 111 are bonded by an adhesive layer 114. Inside the lower electrode 111, there is formed a flow path 111a through which a temperature adjustment medium such as a refrigerant or a heat medium flows.

The substrate support 11 is provided with a temperature sensor 115 capable of detecting a temperature. In the present embodiment, the temperature sensor 115 is provided on the electrostatic chuck 112. For example, the temperature sensor 115 is arranged inside a hole formed in the electrostatic chuck 112, and is connected to the controller 100 via a wiring (not shown). At least one temperature sensor 115 may be provided. The temperature sensor 115 may be provided on the lower electrode 111. The temperature sensor 115 may be provided in the lower electrode 111. For example, the temperature sensor 115 is provided at a position in the lower electrode 111 between the flow path 111a and the upper surface. In the present embodiment, the temperature sensor 115 detects the temperature of the electrostatic chuck 112 as the temperature of the substrate support 11.

By the way, in plasma processing, the progress of processing is changed depending on the temperature of the substrate W. For example, in plasma etching, the etching progress rate is changed depending on the temperature of the substrate W. In the plasma processing apparatus 1, it is difficult to directly measure the temperature of the substrate W. Therefore, in the plasma processing apparatus 1, the temperature of the electrostatic chuck 112 or the lower electrode 111 constituting the substrate support 11 for mounting the substrate W thereon is measured to estimate whether or not the temperature of the substrate W is changed. However, the temperature of the substrate W may have a large error from the estimated temperature due to the influence of the change in the surface state of the substrate support 11.

In FIG. 3, the heat flow during the plasma processing is indicated by arrows. In FIG. 3, the flow of energy in the substrate support 11 in an ignited state in which plasma is ignited is schematically indicated by arrows. When the plasma processing is performed, the temperature of the substrate W is increased due to the heat input from the plasma. In FIG. 3, the amount of heat input from the plasma to the substrate W is divided by the area of the substrate W and is denoted as a heat flux $q_p$ from plasma per unit area.

The heat transferred to the substrate W is transferred to the electrostatic chuck 112. In the transient state described later, not all the heat of the substrate W is transferred to the electrostatic chuck 112. The heat is transferred to the electrostatic chuck 112 depending on the ease of heat transfer, such as the degree of contact between the substrate W and the electrostatic chuck 112, or the like. In FIG. 3, the ease of heat transfer from the substrate W to the surface of the electrostatic chuck 112 is denoted as thermal resistance $R_{th}$ per unit area between the substrate W and the surface of the electrostatic chuck 112. Further, in FIG. 3, the amount of heat input from the substrate W to the surface of the electrostatic chuck 112 is denoted as a heat flux q per unit area from the substrate W to the surface of the electrostatic chuck 112.

The heat transferred to the surface of the electrostatic chuck 112 is transferred to the electrostatic chuck 112, the adhesive layer 114 and the lower electrode 111 in the named order to increase the temperature of the electrostatic chuck 112, the adhesive layer 114 and the lower electrode 111.

Meanwhile, the lower electrode 111 is cooled by the refrigerant flowing through the flow path 111a. When the temperature of the lower electrode 111 is higher than that of the refrigerant, the heat of the lower electrode 111 is dissipated by the refrigerant. The energy of heat dissipated by the refrigerant grows larger as the temperature difference between the lower electrode 111 and the refrigerant increases.

Figure 4:
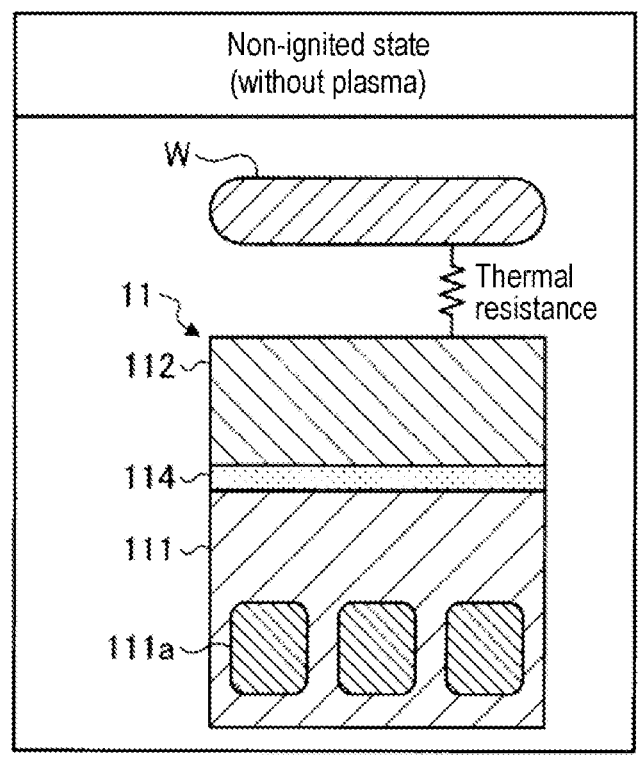
FIG. 4 is a diagram schematically showing an energy flow in the substrate support in a non-ignited state.

FIG. 4 is a diagram schematically showing the energy flow in the substrate support 11 in a non-ignited state. For example, in the non-ignited state in which the plasma is not ignited, heat is dissipated when there is no heat flux $q_p$ and heat flux q and there is a temperature difference with the refrigerant. Therefore, the temperature of the substrate W and the substrate support 11 becomes equal to the temperature of the refrigerant.

On the other hand, in an ignited state in which the plasma is ignited, as shown in FIG. 3, the temperature of the substrate W and the substrate support 11 is increased due to the heat flux $q_p$ from the plasma. In this regard, the ignited state in which the plasma is ignited includes a transient state and a steady state. The transient state is, for example, a state in which the amount of heat input with respect to the substrate W and the substrate support 11 is larger than the amount of heat output with respect to the substrate W and the substrate support 11 and in which the temperatures of the substrate W and the substrate support 11 tend to increase over time. The steady state is a state in which the amount of heat input and the amount of heat output with respect to the substrate W and the substrate support 11 are equal to each other, the temperature of the substrate W and the substrate support 11 does not tend to increase over time, and the temperature becomes substantially constant and stable.

Figure 5:
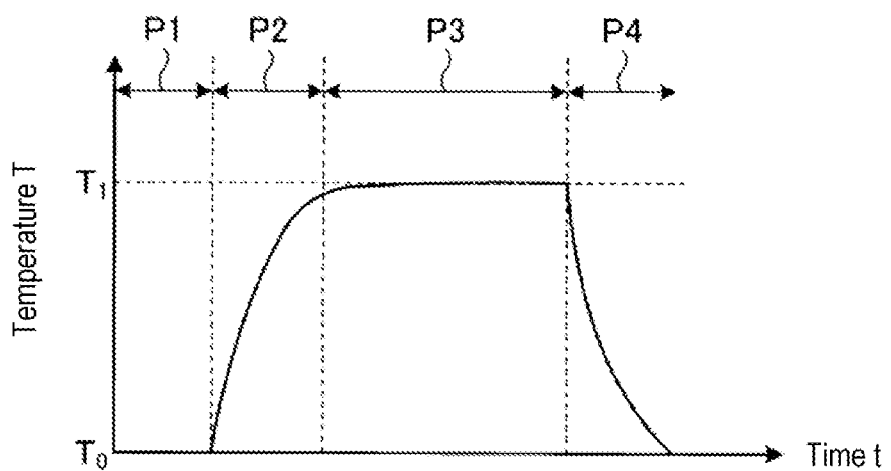
FIG. 5 is a diagram showing an example of a change in the temperature of the substrate support.

FIG. 5 is a diagram showing an example of a change in the temperature of the substrate support 11. The example of FIG. 5 is an example of the result of measuring the temperature of the substrate support 11 when the plasma is ignited from the non-ignited state in which the plasma is not ignited. The period P1 in FIG. 5 is a non-ignited state in which the plasma is not ignited. In the period P1, the temperature of the substrate support 11 is equal to the temperature $T_0$ of the refrigerant. The period P2 in FIG. 5 is an ignited state in which the plasma is ignited, and is a transient state. In the transient state, the temperature of the substrate support 11 continuously increases until it is stabilized. In the period P2, the temperature of the substrate support 11 is increased to a predetermined temperature $T_1$. The period P3 in FIG. 5 is an ignited state in which the plasma is ignited. In the period P3, the temperature of the substrate support 11 is constant and steady state. The period P4 in FIG. 5 is a non-ignited state in which the plasma is extinguished. In the period P4, the temperature of the substrate support 11 drops because the plasma disappears and the heat input from the plasma to the substrate W disappears.

The tendency of the temperature change of the substrate support 11 in the transient state shown in the period P2 of FIG. 5 varies depending on the amount of heat input from the plasma to the substrate W, the thermal resistance $R_{th}$ between the substrate W and the surface of the electrostatic chuck 112, and the like.

The amount of heat input from the plasma to the substrate W can be estimated from the processing conditions of the plasma processing. Further, the amount of heat input from the plasma to the substrate W can also be estimated from the temperature change of the refrigerant flowing through the flow path 111a. For example, in the steady state, the temperatures of the substrate W and the substrate support 11 are constant. Therefore, all the heat inputted from the plasma to the substrate W is dissipated by the refrigerant. For that reason, in the steady state, the amount of increase in the temperature of the refrigerant passed through the flow path 111a is measured. For example, as the amount of increase in the temperature of the refrigerant, the temperature difference between the temperature of the refrigerant discharged from the flow path 111a and the temperature of the refrigerant supplied to the flow path 111a is measured. Then, by multiplying the measured temperature increase amount, the specific heat of the refrigerant and the amount of the refrigerant supplied to the flow path 111a per unit time, it is possible to obtain the amount of heat for the refrigerant to have an increased temperature. The obtained amount of heat can be estimated to be the amount of heat input from the plasma to the substrate W. The heat flux $q_p$ can be estimated, for example, by dividing the amount of heat input from the plasma to the substrate W by the area of the substrate W. Since all the heat inputted from the plasma to the substrate W is transferred in the steady state, the heat flux q is equal to the heat flux $q_p$.

When the plasma processing apparatus 1 performs the same plasma processing on each substrate W while exchanging the substrates W, the amount of heat input from the plasma to the substrate W in each plasma processing may be regarded as remaining the same.

Meanwhile, in the plasma processing apparatus 1, the state of the surface of the substrate support 11 is changed over time due to contact with the substrate W or the influence of the plasma. Due to the change in the ease of heat transfer, such as the degree of contact between the substrate W and the electrostatic chuck 112 or the like, the thermal resistance $R_{th}$ of the substrate W and the electrostatic chuck 112 is changed, and the temperature of the substrate in the steady state is changed. In addition, when the thermal resistance $R_{th}$ is changed, the degree of change in the temperature change of the substrate support 11 in the transient state is changed.

Figure 6:
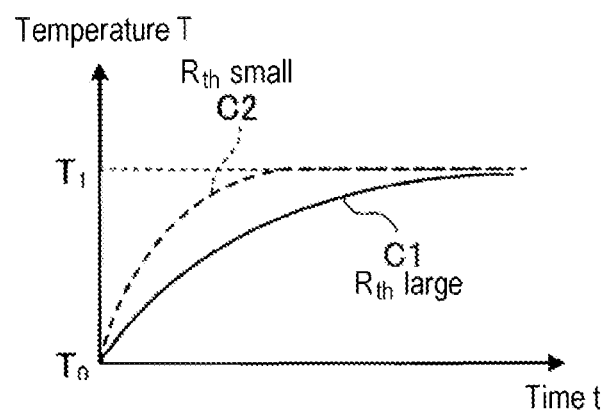
FIG. 6 is a diagram showing an example of a change in the temperature of the substrate support due to a change in the thermal resistance.

FIG. 6 is a diagram showing an example of a change in the temperature of the substrate support 11 due to the change in the thermal resistance $R_{th}$. FIG. 6 shows the temperature change of the substrate support 11 in the transient state from the ignition of the plasma to the stabilization of the temperature of the substrate support 11. The temperature $T_0$ is a temperature before igniting the plasma, for example, the temperature of the refrigerant. The temperature $T_1$ is a steady state temperature at which the temperature of the substrate support 11 is stable. When the thermal resistance $R_{th}$ is large, the temperature of the substrate support 11 gradually increases as indicated by a curve C1. On the other hand, when the thermal resistance $R_{th}$ is small, as indicated by a curve C2, the temperature of the substrate support 11 increases significantly as compared with the curve C1.

The curve of the change in the temperature T of the substrate support 11 in the transient state may be expressed by the following equation (1).

$$T = -(T_1 - T_0)\exp(-t/\tau) + T_1 \quad (1)$$

In the above equation, T is the temperature of the substrate support 11. To is the temperature of the substrate support 11 before igniting the plasma. $T_1$ is the temperature of the substrate support 11 in the steady state. t is the elapsed time. τ is a time constant.

Figure 7:
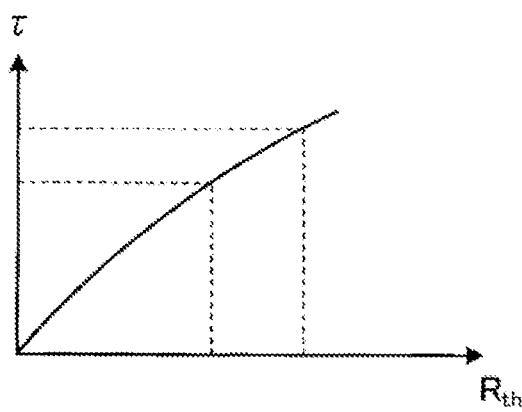
FIG. 7 is a diagram showing the correspondence between a thermal resistance and a time constant.

The curve of the change in the temperature T of the substrate support 11 in the transient state shows that when the thermal resistance $R_{th}$ is large, the time constant τ of the equation (1) also becomes a large value, and when the thermal resistance $R_{th}$ is small, the time constant τ also becomes a small value. Therefore, the thermal resistance $R_{th}$ and the time constant τ have a correlation as shown in FIG. 7. That is, the thermal resistance $R_{th}$ and the time constant τ have a relationship that the larger the value of the thermal resistance $R_{th}$, the larger the value of the time constant τ.

Therefore, the correspondence between the thermal resistance $R_{th}$ and the time constant ti is obtained in advance. The correspondence may be obtained by using the actual plasma processing apparatus 1, or may be obtained by using an experimental apparatus equivalent to the plasma processing apparatus 1. For example, in the plasma processing apparatus 1, the change in the temperature of the substrate support 11 in the transient state from the ignition of plasma to the stabilization of the temperature of the substrate support 11 is measured by variously changing the thermal resistance $R_{th}$ between the substrate W and the substrate support 11. The thermal resistance $R_{th}$ can be changed by changing the surface shape of the substrate support 11 or changing the supply amount of the heat transfer gas supplied to the rear surface side of the substrate W. The thermal resistance $R_{th}$ may be actually measured or calculated. Then, the correspondence between the thermal resistance $R_{th}$ and the time constant τ is obtained from the measured temperature change. For example, the time constant τ is obtained for each thermal resistance $R_{th}$.

Referring back to FIG. 2, the memory 104 stores the data of the correspondence between the thermal resistance $R_{th}$ and the time constant τ obtained in this way. For example, the memory 104 stores thermal resistance data 104a on the thermal resistance $R_{th}$ between the substrate W and the substrate support 11 for each time constant τ of the temperature change of the substrate support 11.

The measurement unit 102a measures the temperature change of the substrate support 11 by the temperature sensor 115 while the temperature of the substrate support 11 is increasing after igniting the plasma. For example, the measurement unit 102a measures the temperature change of the substrate support 11 in the non-ignited state in which the plasma is not ignited and in the transient state from the ignition of the plasma to the stabilization of the temperature of the substrate support 11. The temperature of the substrate support 11 in the non-ignited state may be measured at least once, and may be measured a plurality of times, in which case the average value of the measured temperatures may be used as the temperature of the substrate support 11 in the non-ignited state. The temperature of the substrate support 11 in the transient state may be measured twice or more. The measurement timing for measuring the temperature is preferably the timing at which the temperature tends to increase significantly. Further, when the number of measurements is small, the measurement timings are preferably separated by a predetermined period or more. The measurement unit 102a measures the temperature of the substrate support 11 at a predetermined cycle (e.g., 0.1 second cycle) during the plasma processing period. As a result, a large number of temperatures of the substrate support 11 in the transient state are measured.

The measurement unit 102a measures the temperature change of the substrate support 11 at a predetermined cycle. For example, the measurement unit 102a measures the temperature change of the substrate support 11 every time the substrate W is replaced and the replaced substrate W is mounted on the substrate support 11 to perform plasma processing. Alternatively, for example, the measurement unit 102a may measure the temperature change of the substrate support 11 for each plasma processing.

The acquisition unit 102b acquires the thermal resistance $R_{th}$ of the substrate W and the electrostatic chuck 112 based on the temperature change of the substrate support 11 measured by the measurement unit 102a. For example, the acquisition unit 102b obtains the time constant τ of the temperature change of the substrate support 11 from the temperature change of the substrate support 11 measured by the measurement unit 102a. For example, the acquisition unit 102b fits the temperature change of the substrate support 11 measured by the measurement unit 102a to the equation (1) to obtain the time constant τ. The temperature $T_0$ and the temperature $T_1$ of the formula (1) can be determined from the measurement result of the temperature change. For example, the temperature $T_0$ can be determined as the temperature of the refrigerant or the initial measurement temperature. The temperature Ti can be determined as the temperature in the steady state in which the temperature of the substrate support 11 is stable. In the equation (1), the time constant τ is a parameter. The acquisition unit 102b fits the measured temperature change of the substrate support 11 to the equation (1) with the time constant τ used as a parameter, and obtains the time constant τ that minimizes the error.

The acquisition unit 102b acquires the thermal resistance $R_{th}$ corresponding to the obtained time constant τ with reference to the memory 104. For example, the acquisition unit 102b acquires the thermal resistance $R_{th}$ by reading the thermal resistance $R_{th}$ corresponding to the obtained time constant τ from the thermal resistance data 104a. As described above, the plasma processing apparatus 1 according to the present embodiment can acquire the thermal resistance $R_{th}$ between the substrate W and the substrate support 11.

The acquisition unit 102b acquires the thermal resistance $R_{th}$ from the temperature change of the substrate support 11 measured by the measurement unit 102a every predetermined cycle. As a result, the plasma processing apparatus 1 according to the present embodiment can detect a change in the surface state of the substrate support 11 from the thermal resistance $R_{th}$ acquired every predetermined cycle.

The adjuster 102c adjusts the temperature of the substrate support 11 or the thermal resistance $R_{th}$ of the substrate W and the substrate support 11 based on the time-dependent change of the thermal resistance $R_{th}$ acquired by the acquisition unit 102b every predetermined cycle. The temperature change of the substrate W due to the change of the thermal resistance $R_{th}$ in the steady state may be expressed by the following equation (2).

$$\Delta T_w = q \cdot \Delta R_{th} \qquad (2)$$

In the above equation, $\Delta T_w$ is the temperature change of the substrate W. q is the heat flux from the substrate W to the surface of the electrostatic chuck 112. $\Delta R_{th}$ is the amount of change in the thermal resistance $R_{th}$.

For example, the adjuster 102c obtains the temperature change ΔT of the substrate W from the change amount $\Delta R_{th}$ of the thermal resistance $R_{th}$ according to the equation (2). The adjuster 102c adjusts the temperature of the substrate support 11 or the thermal resistance $R_{th}$ of the substrate W and the substrate support 11 so that the temperature change ΔT of the substrate W becomes small. For example, the adjuster 102c controls the chiller unit 14 so that when the temperature change ΔT is a temperature decrease, the temperature of the refrigerant is increased just as much as the temperature change ΔT, and when the temperature change ΔT is a temperature increase, the temperature of the refrigerant is decreased just as much as the temperature change ΔT. In addition, for example, the adjuster 102c executes control so that when the temperature change ΔT is a temperature decrease, the supply amount of the heat transfer gas supplied to the rear surface of the substrate W is decreased, and when the temperature change ΔT is a temperature increase, the supply amount of the heat transfer gas supplied to the rear surface of the substrate W is increased.

Thus, the plasma processing apparatus 1 according to the present embodiment can suppress the time-dependent change in the temperature of the substrate W during the plasma processing even when the thermal resistance $R_{th}$ is changed over time. As a result, the plasma processing apparatus 1 can suppress the change in the characteristics of the plasma processing.

In the embodiment, there has been described the case where as shown in the period P2 of FIG. 5, the thermal resistance $R_{th}$ between the substrate W and the substrate support 11 is acquired from the temperature change of the substrate support 11 in the transient state from the ignition of the plasma to the stabilization of the temperature of the substrate support 11. However, the period that can be used for acquiring the thermal resistance $R_{th}$ is not limited thereto. For example, the tendency of change in the temperature of the substrate support 11 during the period from the extinguishment of the plasma to the stabilization of the temperature of the substrate support 11 as in the period P4 of FIG. 5 is also changed depending on the thermal resistance $R_{th}$ between the substrate W and the surface of the electrostatic chuck 112. Therefore, the thermal resistance $R_{th}$ between the substrate W and the substrate support 11 may be acquired from the temperature change of the substrate support 11 during the period from the extinguishment of the plasma to the stabilization of the temperature of the substrate support 11 shown in the period P4 of FIG. 5. For example, the correspondence between the time constant of the temperature change of the substrate support 11 and the thermal resistance of the substrate support 11 when the temperature of the substrate support 11 drops after extinguishment of the plasma as shown in the period P4 of FIG. 5 is obtained in advance. The memory 104 stores the thermal resistance $R_{th}$ between the substrate W and the substrate support 11 for each time constant of the temperature change of the substrate support 11 after extinguishment of the plasma. The measurement unit 102a measures, by the temperature sensor 115, the temperature change of the substrate support 11 while the temperature of the substrate support 11 is decreasing after the plasma processing is completed and the plasma is extinguished. The acquisition unit 102b acquires the thermal resistance $R_{th}$ between the substrate W and the substrate support 11 based on the temperature change of the substrate support 11 measured by the measurement unit 102a. For example, the acquisition unit 102b obtains the time constant of the temperature change of the substrate support 11 from the temperature change of the substrate support 11 in the period P4 of FIG. 5. The acquisition unit 102b acquires the thermal resistance $R_{th}$ corresponding to the obtained time constant with reference to the memory 104. Also, in this case, the plasma processing apparatus 1 can acquire the thermal resistance $R_{th}$ between the substrate W and the substrate support 11.

[Flow of Thermal Resistance Acquisition]

Figure 8:
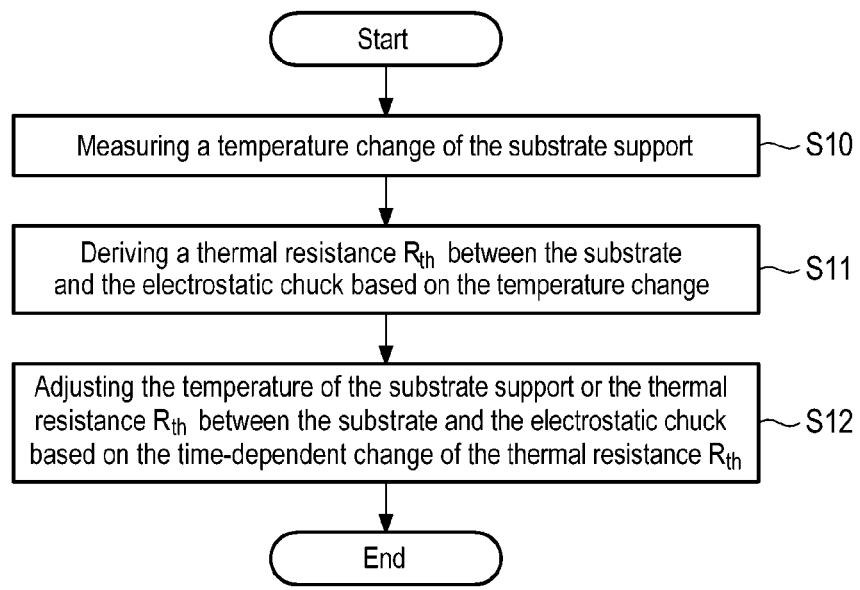
FIG. 8 is a flowchart showing an example of the flow of a thermal resistance acquisition method according to an embodiment.

Next, a method of acquiring a thermal resistance using the plasma processing apparatus 1 according to the present embodiment will be described. FIG. 8 is a flowchart showing an example of the flow of the thermal resistance acquisition method according to the embodiment. This temperature control method is executed at a predetermined timing, for example, at a timing at which the plasma processing is started.

The measurement unit 102a measures, by the temperature sensor 115, the temperature change of the substrate support 11 while the temperature of the substrate support 11 is increasing after igniting the plasma (step S10).

The acquisition unit 102b acquires the thermal resistance $R_{th}$ of the substrate W and the electrostatic chuck 112 based on the measured temperature change of the substrate support 11 (step S11). For example, the acquisition unit 102b obtains the time constant τ of the temperature change of the substrate support 11 from the measured temperature change of the substrate support 11. The acquisition unit 102b acquires the thermal resistance $R_{th}$ corresponding to the obtained time constant i with reference to the memory 104.

The adjuster 102c adjusts the temperature of the substrate support 11 or the thermal resistance $R_{th}$ of the substrate W and the substrate support 11 based on the time-dependent change of the acquired thermal resistance $R_{th}$ (step S12). Then, the process comes to an end.

As described above, the plasma processing apparatus 1 according to the first embodiment includes the substrate support 11, the temperature sensor 115 (detector), the measurement unit 102a, and the acquisition unit 102b. The substrate W is supported on the substrate support 11. The temperature sensor 115 detects the temperature of the substrate support 11. The measurement unit 102a measures, by the temperature sensor 115, the temperature change of the substrate support 11 while the temperature of the substrate support 11 is increasing after igniting the plasma, or while the temperature of the substrate support 11 is decreasing after the plasma processing is completed and the plasma is extinguished. The acquisition unit 102b acquires the thermal resistance $R_{th}$ between the substrate W and the substrate support 11 based on the temperature change of the substrate support 11 measured by the measurement unit 102a. In this way, the plasma processing apparatus 1 can acquire the thermal resistance $R_{th}$ between the substrate W and the substrate support 11.

Further, the plasma processing apparatus 1 further includes the adjuster 102c. The measurement unit 102a measures the temperature change of the substrate support 11 at a predetermined cycle while the temperature of the substrate support 11 is increasing after igniting the plasma, or while the temperature of the substrate support 11 is decreasing after the plasma processing is completed and the plasma is extinguished. The acquisition unit 102b acquires the thermal resistance $R_{th}$ from the temperature change of the substrate support 11 measured by the measurement unit 102a every predetermined cycle. The adjuster 102c adjusts the temperature of the substrate support 11 or the thermal resistance between the substrate W and the substrate support 11 based on the time-dependent change of the thermal resistance $R_{th}$ acquired by the acquisition unit 102b every predetermined cycle. As described above, the plasma processing apparatus 1 can suppress the time-dependent change in the temperature of the substrate W during the plasma processing even when the thermal resistance $R_{th}$ is changed over time.

Further, the plasma processing apparatus 1 further includes the memory 104. The memory 104 stores the thermal resistance $R_{th}$ between the substrate W and the substrate support 11 for each time constant τ of the temperature change of the substrate support 11. The acquisition unit 102b obtains the time constant τ of the temperature change of the substrate support 11 from the temperature change of the substrate support 11 measured by the measurement unit 102a. The acquisition unit 102b acquires the thermal resistance $R_{th}$ corresponding to the obtained time constant τ with reference to the memory 104. In this way, the plasma processing apparatus 1 can acquire the thermal resistance $R_{th}$.

Second Embodiment

Next, a second embodiment will be described. Since the plasma processing apparatus 1 and the controller 100 according to the second embodiment have the same configurations as the plasma processing apparatus 1 and the controller 100 according to the first embodiment shown in FIGS. 1 and 2, the description thereof will be omitted.

Figure 9:
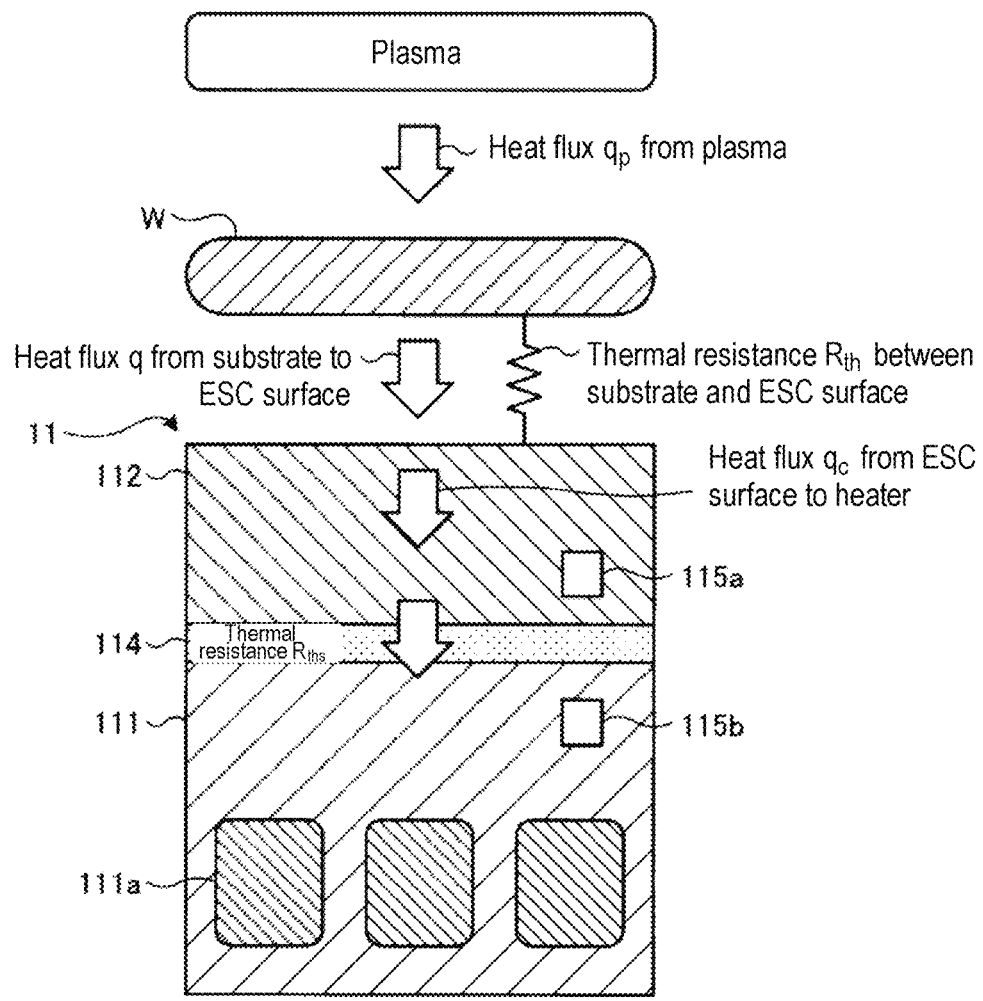
FIG. 9 is a diagram showing an example of a schematic configuration of a substrate support according to a second embodiment.

FIG. 9 is a diagram showing an example of a schematic configuration of a substrate support 11 according to the second embodiment. Since the substrate support 11 according to the second embodiment has the same configuration as the substrate support 11 according to the first embodiment shown in FIG. 3, the same parts are designated by like reference numerals and the description thereof will be omitted. The different parts will be mainly described.

The electrostatic chuck 112 and the lower electrode 111 are bonded by an adhesive layer 114. The substrate support 11 according to the second embodiment may be provided with temperature sensors 115a and 115b. The temperature sensor 115a detects the temperature of the electrostatic chuck 112. The temperature sensor 115b detects the temperature of the lower electrode 111.

When the plasma processing is performed, the temperature of the substrate W is increased due to the heat input from the plasma. The heat transferred to the substrate W is transferred to the electrostatic chuck 112. In the transient state, not all the heat of the substrate W is transferred to the electrostatic chuck 112. The heat is transferred to the electrostatic chuck 112 depending on the ease of heat transfer, such as the degree of contact between the substrate W and the electrostatic chuck 112, or the like. Further, in the substrate support 11, the ease of heat transfer of the adhesive layer 114 may be changed due to the influence of plasma or the deterioration of the adhesive layer 114.

In FIG. 9, the ease of heat transfer from the substrate W to the surface of the electrostatic chuck 112 is denoted as the thermal resistance $R_{th}$ per unit area between the substrate W and the surface of the electrostatic chuck 112. Further, in FIG. 9, the ease of heat transfer of the adhesive layer 114 is denoted as the thermal resistance $R_{ths}$ per unit area of the adhesive layer 114.

The heat transferred to the surface of the electrostatic chuck 112 is transferred in the order of the electrostatic chuck 112, the adhesive layer 114 and the lower electrode 111 to increase the temperature of the electrostatic chuck 112, the adhesive layer 114 and the lower electrode 111. The temperature of the electrostatic chuck 112 and the lower electrode 111 is increased in the transient state. The temperature change of the electrostatic chuck 112 and the lower electrode 111 is affected by the thermal resistance $R_{th}$ and the thermal resistance $R_{ths}$. Therefore, the time constants of the temperature changes of the electrostatic chuck 112 and the lower electrode 111 are related to the thermal resistance $R_{th}$ and the thermal resistance $R_{ths}$.

Therefore, the correspondence between the time constant of the temperature change of the electrostatic chuck 112 and the lower electrode 111 and the thermal resistance $R_{th}$ and the thermal resistance $R_{th}$ is obtained in advance. The correspondence may be obtained by using the actual plasma processing apparatus 1, or may be obtained by using an experimental apparatus equivalent to the plasma processing apparatus 1. For example, in the plasma processing apparatus 1, the thermal resistance $R_{ths}$ of the adhesive layer 114 and the thermal resistance $R_{th}$ between the substrate W and the substrate support 11 are variously changed, and the temperature changes of the electrostatic chuck 112 and the lower electrode 111 in the transient state from the ignition of the plasma to the stabilization of the temperature of the substrate support 11. The thermal resistance $R_{ths}$ can be changed by changing the thickness of the adhesive layer 114.

The thermal resistance $R_{th}$ can be changed by changing the surface shape of the substrate support 11 or changing the supply amount of the heat transfer gas supplied to the rear surface side of the substrate W. The thermal resistance $R_{ths}$ and the thermal resistance $R_{th}$ may be actually measured or calculated. Then, the correspondence between the thermal resistance $R_{th}$ and the thermal resistance $R_{th}$ and the time constants of the electrostatic chuck 112 and the lower electrode 111 is obtained from the measured temperature changes. For example, the time constant of the temperature change of the electrostatic chuck 112 and the lower electrode 111 is obtained for each combination of the thermal resistance $R_{ths}$ and the thermal resistance $R_{th}$.

The memory 104 stores data on the correspondence between the thermal resistance $R_{ths}$ and the thermal resistance $R_{th}$ and the time constants of the electrostatic chuck 112 and the lower electrode 111 thus obtained. For example, the memory 104 stores the thermal resistance data 104a on the thermal resistance $R_{ths}$ of the adhesive layer 114 and the thermal resistance $R_{th}$ between the substrate W and the substrate support 11 for each combination of the time constants of the temperature changes of the electrostatic chuck 112 and the lower electrode 111.

The measurement unit 102a measures, by the temperature sensors 115a and 115b, the temperature changes of the electrostatic chuck 112 and the lower electrode 111 while the temperature of the substrate support 11 is increasing after the plasma is ignited. For example, the measurement unit 102a measures the temperature changes of the temperature sensors 115a and 115b in the non-ignited state in which the plasma is not ignited and in the transient state from the ignition of the plasma to the stabilization of the temperatures of the temperature sensors 115a and 115b.

The measurement unit 102a measures the temperature changes of the electrostatic chuck 112 and the lower electrode 111 at a predetermined cycle. For example, the measurement unit 102a measures the temperature changes of the electrostatic chuck 112 and the lower electrode 111 each time when the substrate W is replaced and the replaced substrate W is mounted on the substrate support 11 to perform plasma processing. Alternatively, for example, the measurement unit 102a may measure the temperature change of the electrostatic chuck 112 and the lower electrode 111 for each plasma processing.

The acquisition unit 102b acquires the thermal resistance $R_{ths}$ of the adhesive layer 114 and the thermal resistance $R_{th}$ between the substrate W and the substrate support 11 based on the temperature changes of the electrostatic chuck 112 and the lower electrode 111 measured by the measurement unit 102a. For example, the acquisition unit 102b obtains each of the time constants of the temperature changes of the electrostatic chuck 112 and the lower electrode 111 from the temperature change of the substrate support 11 measured by the measurement unit 102a. For example, the acquisition unit 102b fits the temperature change of the electrostatic chuck 112 to the equation (1) with the time constant τ used as a parameter, and obtains the time constant of the temperature change of the electrostatic chuck 112 having the smallest error. Further, the acquisition unit 102b fits the temperature change of the lower electrode 111 to the equation (1) with the time constant τ used as a parameter, and obtains the time constant of the temperature change of the lower electrode 111 having the smallest error.

The acquisition unit 102b acquires the thermal resistance $R_{ths}$ of the adhesive layer 114 and the thermal resistance $R_{th}$ between the substrate W and the substrate support 11 corresponding to the combination of the obtained time constants of the temperature changes of the electrostatic chuck 112 and the lower electrode 111 with reference to the memory 104. For example, the acquisition unit 102b acquires the thermal resistance $R_{ths}$ and the thermal resistance $R_{th}$ by reading out the thermal resistance $R_{ths}$ and the thermal resistance $R_{th}$ corresponding to the combination of the obtained time constants of the temperature changes of the electrostatic chuck 112 and the lower electrode 111 from the thermal resistance data 104a. As described above, the plasma processing apparatus 1 according to the present embodiment can acquire the thermal resistance $R_{ths}$ of the adhesive layer 114 and the thermal resistance $R_{th}$ between the substrate W and the substrate support 11.

The acquisition unit 102b acquires the thermal resistance $R_{th}$ and the thermal resistance $R_{th}$ from the temperature change of the substrate support 11 measured by the measurement unit 102a every predetermined cycle. As a result, the plasma processing apparatus 1 according to the present embodiment can detect a change in the surface state of the substrate support 11 from the thermal resistance $R_{th}$ acquired every predetermined cycle. Further, the plasma processing apparatus 1 according to the present embodiment can detect a change in the state of the adhesive layer 114 from the thermal resistance $R_{ths}$ acquired every predetermined cycle.

As described above, in the substrate support 11, the electrostatic chuck 112 for electrostatically attracting the substrate W and the lower electrode 111 (base) are stacked one above another and bonded by the adhesive layer 114. The temperature sensors 115a and 115b (detectors) are provided on the electrostatic chuck 112 and the lower electrode 111, respectively. The measurement unit 102a measures, by the temperature sensors 115a and 115b, the temperature changes of the electrostatic chuck 112 and the lower electrode 111 while the temperature of the substrate support 11 is increasing after igniting the plasma, or while the temperature of the substrate support 11 is decreasing after the plasma processing is completed and the plasma is extinguished. The memory 104 stores the thermal resistance $R_{ths}$ of the adhesive layer 114 and the thermal resistance $R_{th}$ between the substrate W and the substrate support 11 for each combination of the time constants of the temperature changes of the electrostatic chuck 112 and the lower electrode 111. The acquisition unit 102b obtains the time constants of the temperature changes of the electrostatic chuck 112 and the lower electrode 111 from the temperature changes of the electrostatic chuck 112 and the lower electrode 111 measured by the measurement unit 102a. The acquisition unit 102b acquires the thermal resistance $R_{th}$ of the adhesive layer 114 and the thermal resistance $R_{th}$ between the substrate W and the substrate support 11 corresponding to the combination of the obtained time constants of the temperature changes of the electrostatic chuck 112 and the lower electrode 111 with reference to the memory 104. As described above, the plasma processing apparatus 1 according to the present embodiment can acquire the thermal resistance $R_{ths}$ of the adhesive layer 114 and the thermal resistance $R_{th}$ between the substrate W and the substrate support 11.

Third Embodiment

Next, a third embodiment will be described. The plasma processing apparatus 1 and the controller 100 according to the third embodiment have the same configurations as the plasma processing apparatus 1 and the controller 100 according to the first and second embodiments shown in FIGS. 1 and 2. Therefore, the description thereof will be omitted.

Just like the first embodiment, the substrate support 11 according to the third embodiment may be schematically shown as in FIG. 3.

The substrate support 11 is provided with a temperature sensor 115 capable of detecting a temperature. In the present embodiment, the electrostatic chuck 112 is provided with a temperature sensor 115 capable of detecting a temperature. The temperature sensor 115 may be provided on the lower electrode 111. The temperature sensor 115 may be provided at a position above the flow path 111a in the lower electrode 111. In the present embodiment, the temperature sensor 115 detects the temperature of the electrostatic chuck 112 as the temperature of the substrate support 11.

Figure 10:
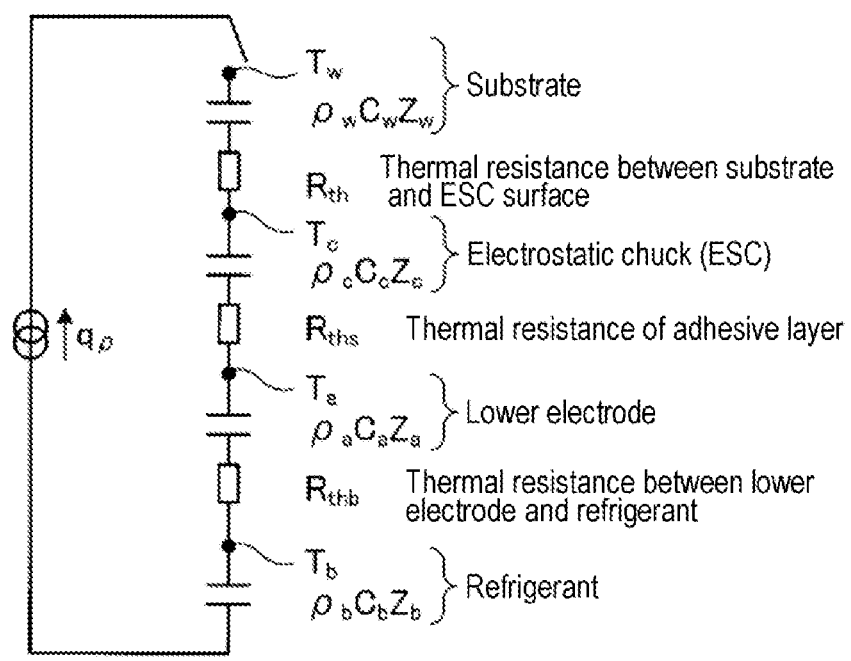
FIG. 10 is a diagram showing the substrate support as a thermal circuit.

In FIG. 3, the heat flow during plasma processing is indicated by arrows. Such a heat flow in the substrate support 11 may be represented as a thermal circuit. FIG. 10 is a diagram showing the substrate support 11 as a thermal circuit. "$q_p$" is the heat flux from plasma. "T" is the temperature. "$\rho$" is the density. "C" is the specific heat. "Z" is the thickness. Subscripts "w", "c", "a" and "b" are added to "T", "$\rho$", "C" and "Z" to indicate the corresponding members. "w" indicates the substrate W. "c" indicates the electrostatic chuck 112. "a" indicates the lower electrode 111. "b" indicates the refrigerant. For example, $T_w$ represents the temperature of the substrate W. Further, $\rho_c$ represents the density of the electrostatic chuck 112. $C_a$ represents the specific heat of the lower electrode 111. Further, $Z_b$ represents the thickness of the refrigerant. For example, the height (thickness) of the flow path 111a corresponds to the thickness of the refrigerant. $R_{th}$ is the thermal resistance between the substrate W and the electrostatic chuck 112 (ESC). $R_{ths}$ is the thermal resistance per unit area of the adhesive layer 114. $R_{thb}$ is the thermal resistance per unit area of the refrigerant.

When the substrate support 11 is represented as a thermal circuit, relational expressions can be defined. For example, $K_0$, $K_1$, $K_2$, $K_3$, $K_4$ and $K_5$ are expressed as the following equations (3) to (8), and the derivative D is expressed as the following equation (9).

$$K_0 = q_p/(\rho_w C_w Z_w) \quad (3)$$

$$K_1 = 1/(\rho_w C_w Z_w \cdot R_{th}) \quad (4)$$

$$K_2 = 1/(\rho_c C_c Z_c \cdot R_{th}) \quad (5)$$

$$K_3 = 1/(\rho_c C_c Z_c \cdot R_{ths}) \quad (6)$$

$$K_4 = 1/(\rho_b C_b Z_b \cdot R_{ths}) \quad (7)$$

$$K_5 = 1/(\rho_b C_b Z_b \cdot R_{thb}) \quad (8)$$

$$D \equiv d/dt \quad (9)$$

In this case, the behavior of the temperature $T_c$ of the electrostatic chuck 112 follows the solution of the following differential equation (10).

$$\{D^4 + (K_1+K_2+K_3+K_4+2K_5)D^3 + [(K_1+K_2+K_3)(K_4+2K_5)+K_1K_3-K_3K_4+K_4\cdot K_5]D^2 + [(K_1+K_2)K_4K_3+2K_1K_3K_5]D\}T_c = K_0K_2K_3K_5 \quad (10)$$

The thickness $Z_w$ of the substrate W, the density $\rho_w$ of the substrate W and the specific heat $C_w$ of the substrate W are determined in advance according to the substrate W. The thickness $Z_c$ of the electrostatic chuck 112, the density $\rho_c$ of the electrostatic chuck 112 and the specific heat $C_c$ of the electrostatic chuck 112 are determined in advance according to the design data of the electrostatic chuck 112, the actual configuration of the electrostatic chuck 112, and the material. The thickness $Z_a$ of the lower electrode 111, the density $\rho_a$ of the lower electrode 111 and the specific heat $C_a$ of the lower electrode 111 are determined in advance according to the design data of the lower electrode 111, the actual configuration of the lower electrode 111, and the material. The thickness $Z_b$ of the refrigerant, the density $\rho_b$ of the refrigerant and the specific heat $C_b$ of the refrigerant are determined in advance according to the design data of the flow path 111a and the material of the refrigerant.

Assuming that the ease of heat transfer of the adhesive layer 114 does not change, the thermal resistance $R_{ths}$ is a constant value and is determined in advance according to the design data of the adhesive layer 114, the actual configuration of the adhesive layer 114, and the material. The thermal resistance $R_{thb}$ per unit area of the refrigerant is also determined in advance according to the design data of the flow path 111a, the material of the refrigerant, the flow rate of the refrigerant, and the like.

t is the elapsed time from the ignition of the plasma. The temperature $T_c$ is the temperature of the electrostatic chuck 112. As the elapsed time t and the temperature Tc, the measurement results in the transient state may be applied.

Therefore, the equation (10) is a relational expression relating to the heat transfer of the temperature $T_c$ of the electrostatic chuck 112 in which the thermal resistance $R_{th}$ of the substrate W and the electrostatic chuck 112 is used as a parameter.

The measurement unit 102a measures, by the temperature sensor 115, the temperature change of the substrate support 11 while the temperature of the substrate support 11 is increasing after igniting the plasma. For example, the measurement unit 102a measures the change in the temperature $T_c$ of the electrostatic chuck 112 in the non-ignited state in which the plasma is not ignited and the transient state from the ignition of the plasma to the stabilization of the temperature $T_c$ of the electrostatic chuck 112.

The measurement unit 102a measures the change in the temperature of the substrate support 11 at a predetermined cycle. For example, the measurement unit 102a measures the change in the temperature $T_c$ of the electrostatic chuck 112 every time when the substrate W is replaced and the replaced substrate W is mounted on the substrate support 11 to perform plasma processing. Alternatively, for example, the measurement unit 102a may measure the change in the temperature $T_c$ of the electrostatic chuck 112 for each plasma processing.

The acquisition unit 102b acquires the thermal resistance $R_{th}$ of the substrate W and the electrostatic chuck 112 based on the temperature change of the substrate support 11 measured by the measurement unit 102a. For example, the acquisition unit 102b acquires the thermal resistance $R_{th}$ by fitting the temperature change of the substrate support 11 measured by the measurement unit 102a to the equation (10) in which the thermal resistance $R_{th}$ of the substrate W and the electrostatic chuck 112 is used as a parameter. For example, the acquisition unit 102b obtains the thermal resistance $R_{th}$ having the smallest error by fitting the temperature $T_c$ of the electrostatic chuck 112 at the measured elapsed time t to the equation (10). As described above, the plasma processing apparatus 1 according to the present embodiment can acquire the thermal resistance $R_{th}$ between the substrate W and the substrate support 11.

The acquisition unit 102b acquires the thermal resistance $R_{th}$ from the temperature change of the substrate support 11 measured by the measurement unit 102a every predetermined cycle. As a result, the plasma processing apparatus 1 according to the present embodiment can detect a change in the surface state of the substrate support 11 from the thermal resistance $R_{th}$ acquired every predetermined cycle.

There has been described the case where the temperature of the electrostatic chuck 112 is detected as the temperature of the substrate support 11 by the temperature sensor 115. However, when the temperature sensor 115 detects the temperature Ta of the lower electrode 111 as the temperature of the substrate support 11, the following equation (11) is used instead of the equation (10). The behavior of the temperature $T_a$ of the lower electrode 111 follows the solution of the differential equation (11).

$$\{D^4+(K_1+K_2+K_3+K_4+2K_5)D^3+[K_1K_3+K_4K_5+(K_1K_2-K_3)(K_4+K_5)]D^2+[K_1K_3(K_4+2K_5)+K_4K_5(K_1K_2K_3)]D+K_1K_3K_4K_5-[K_3K_4D^2+(K_1+K_5)K_3K_4D+K_1K_3K_4K_5\}T_a=K_0K_2K_4K_5 \qquad (11)$$

In the equation (11), the temperature $T_a$ is the temperature of the lower electrode 111. As the elapsed time t and the temperature $T_a$, the measurement results in the transient state may be applied.

The equation (11) is a relational expression relating to the transfer of the temperature $T_a$ of the lower electrode 111 in which the thermal resistance $R_{th}$ of the substrate W and the electrostatic chuck 112 is used as a parameter.

Also in this case, the measurement unit 102a measures, by the temperature sensor 115, the temperature change of the substrate support 11 while the temperature of the substrate support 11 is increasing after the plasma is ignited. For example, the measurement unit 102a measures the change in the temperature $T_a$ of the lower electrode 111 in the non-ignited state in which the plasma is not ignited and in the transient state from the ignition of the plasma to the stabilization of the temperature $T_a$ of the lower electrode 111.

The acquisition unit 102b acquires the thermal resistance $R_{th}$ of the substrate W and the electrostatic chuck 112 based on the temperature change of the substrate support 11 measured by the measurement unit 102a. For example, the acquisition unit 102b obtains the thermal resistance $R_{th}$ having the smallest error by fitting the temperature $T_a$ of the lower electrode 111 at the measured elapsed time t to the equation (11). Also in this case, the plasma processing apparatus 1 according to the present embodiment can acquire the thermal resistance $R_{th}$ between the substrate W and the substrate support 11.

Further, in the embodiment, there has been described the case where the relational expression relating to the heat transfer of the substrate support 11 is a differential equation just like the equations (10) and (11). However, the relational expression relating to the heat transfer of the substrate support 11 is not limited thereto. For example, the relational expression relating to the heat transfer of the substrate support 11 may be an expression obtained by solving the equations (10) and (11) with respect to the thermal resistance $R_{th}$. For such an equation as well, the thermal resistance $R_{th}$ can be acquired by performing fitting with the thermal resistance $R_{th}$ used as a parameter.

As described above, the acquisition unit 102b acquires the thermal resistance $R_{th}$ by fitting the temperature change of the substrate support 11 measured by the measurement unit 102a to the relational expressions (equations (10) and (11)) relating to the heat transfer of the substrate support 11 in which the thermal resistance $R_{th}$ between the substrate W and the substrate support 11 is as a parameter. In this way, the plasma processing apparatus 1 can acquire the thermal resistance $R_{th}$ between the substrate W and the substrate support 11.

Fourth Embodiment

Next, a fourth embodiment will be described. The plasma processing apparatus 1 and the controller 100 according to the fourth embodiment have the same configurations as the plasma processing apparatus 1 and the controller 100 according to the first to third embodiments shown in FIGS. 1 and 2. Therefore, the description thereof will be omitted.

Just like the second embodiment shown in FIG. 9, the substrate support 11 according to the fourth embodiment may be provided with temperature sensors 115a and 115b for detecting the temperatures of the electrostatic chuck 112 and the lower electrode 111.

As described in the second embodiment, in the substrate support 11, the ease of heat transfer of the adhesive layer 114 may be changed due to the influence of plasma, the deterioration or the like. That is, the thermal resistance $R_{ths}$ of the adhesive layer 114 is changed.

In the fourth embodiment, the equations (10) and (11) described in the third embodiment are the relational expressions relating to the heat transfer of the substrate support 11 in which the thermal resistance $R_{th}$ of the substrate W and the electrostatic chuck 112 and the thermal resistance $R_{th}$ of the adhesive layer 114 are used as parameters. Alternatively, the relational expression relating to the heat transfer of the substrate support 11 may be the equation obtained by solving each of the equations (10) and (11) with respect to the thermal resistance $R_{th}$.

The measurement unit 102a measures, by the temperature sensors 115a and 115b, the temperature changes of the electrostatic chuck 112 and the lower electrode 111 while the temperature of the substrate support 11 is increasing after the plasma is ignited. For example, the measurement unit 102a measures the temperature changes of the temperature sensors 115a and 115b in the non-ignited state in which the plasma is not ignited and in the transient state from the ignition of the plasma to the stabilization of the temperature of the temperature sensors 115a and 115b.

The measurement unit 102a measures the temperature changes of the electrostatic chuck 112 and the lower electrode 111 at a predetermined cycle. For example, the measurement unit 102a measures the temperature changes of the electrostatic chuck 112 and the lower electrode 111 each time when the substrate W is replaced and the replaced substrate W is mounted on the substrate support 11 to perform plasma processing. Alternatively, for example, the measurement unit 102a may measure the temperature changes of the electrostatic chuck 112 and the lower electrode 111 for each plasma processing.

The acquisition unit 102b acquires the thermal resistance $R_{ths}$ of the adhesive layer 114 and the thermal resistance $R_{th}$ between the substrate W and the substrate support 11 based on the temperature changes of the electrostatic chuck 112 and the lower electrode 111 measured by the measurement unit 102a. For example, the acquisition unit 102b acquires the thermal resistance $R_{ths}$ and the thermal resistance $R_{th}$ by fitting the temperature changes of the electrostatic chuck 112 and the lower electrode 111 measured by the measurement unit 102a to the equations (10) and (11). For example, the acquisition unit 102b obtains the thermal resistance $R_{ths}$ and the thermal resistance $R_{th}$ having the smallest error by fitting the temperature $T_c$ of the electrostatic chuck 112 and the temperature $T_a$ of the lower electrode 111 at the measured elapsed time t to the equations (10) and (11). As described above, the plasma processing apparatus 1 according to the present embodiment can acquire the thermal resistance $R_{ths}$ of the adhesive layer 114 and the thermal resistance $R_{th}$ between the substrate W and the substrate support 11.

The acquisition unit 102b acquires the thermal resistance $R_{ths}$ and the thermal resistance $R_{th}$ from the temperature change of the substrate support 11 measured by the measurement unit 102a every predetermined cycle. As a result, the plasma processing apparatus 1 according to the present embodiment can detect a change in the surface state of the substrate support 11 from the thermal resistance $R_{th}$ acquired every predetermined cycle. In addition, the plasma processing apparatus 1 according to the present embodiment can detect a change in the state of the adhesive layer 114 from the thermal resistance $R_{ths}$ acquired every predetermined cycle.

As described above, in the substrate support 11, the electrostatic chuck 112 for electrostatically attracting the substrate W and the lower electrode 111 (base) are stacked one above the other and bonded by the adhesive layer 114. The temperature sensors 115a and 115b (detectors) are provided on the electrostatic chuck 112 and the lower electrode 111, respectively. The measurement unit 102a measures, by the temperature sensors 115a and 115b, the temperature changes of the electrostatic chuck 112 and the lower electrode 111 while the temperature of the substrate support 11 is increasing after igniting the plasma, or while the temperature of the substrate support 11 is decreasing after the plasma processing is completed and the plasma is extinguished. The acquisition unit 102b acquires the thermal resistance $R_{ths}$ of the adhesive layer 114 and the thermal resistance $R_{th}$ between the substrate W and the substrate support 11 by fitting the temperature changes of the electrostatic chuck 112 and the lower electrode 111 measured by the measurement unit 102a to the relational expressions (equations (10) and (11)) relating to the heat transfer of the substrate support 11 in which the thermal resistance $R_{ths}$ of the adhesive layer 114 and the thermal resistance $R_{th}$ between the substrate W and the substrate support 11 are used as parameters. As described above, the plasma processing apparatus 1 according to the present embodiment can acquire the thermal resistance $R_{ths}$ of the adhesive layer 114 and the thermal resistance $R_{th}$ between the substrate W and the substrate support 11.

Although the embodiments have been described above, it should be noted that the embodiments disclosed herein are exemplary in all respects and not limitative. Indeed, the embodiments described above may be embodied in a variety of forms. Moreover, the above-described embodiments may be omitted, replaced or modified in various forms without departing from the scope of claims and the gist thereof.

For example, in the above-described embodiments, the case where the semiconductor wafer as the substrate W is subjected to plasma processing has been described by way of example. However, the present disclosure is not limited thereto. The substrate W may be any substrate as long as it is affected by the progress of plasma processing depending on the temperature.

Further, in the above-described embodiments, the case where plasma etching is performed as the plasma processing has been described by way of example. However, the present disclosure is not limited thereto. The plasma processing may be any processing as long as it is affected by the progress of the processing depending on the temperature.

It should be noted that the embodiments disclosed herein are exemplary in all respects and not limitative. Indeed, the above-described embodiments may be embodied in a variety of forms. Further, the above-described embodiments may be omitted, replaced or modified in various forms without departing from the scope of the appended claims and the spirit thereof.

According to the present disclosure in some embodiments, it is possible to acquire the thermal resistance between the substrate and the substrate support.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
   a substrate support on which a substrate is supported;
   a detector configured to detect a temperature of the substrate support;
   a measurer configured to measure, by the detector, a temperature change of the substrate support at a predetermined cycle while the temperature of substrate support is increasing after igniting plasma or while the temperature of the substrate support is decreasing after the plasma processing is completed and the plasma is extinguished, based on the temperature of the substrate support detected by the detector;
   a memory configured to store a thermal resistance between the substrate and the substrate support for each time constant of the temperature change of the substrate support; and
   a controller that executes a control program stored in the memory to control an overall operation of the plasma processing apparatus,
   wherein the controller is configured to calculate the thermal resistance between the substrate and the substrate support based on the temperature change of the substrate support measured by the measurer,
   wherein the controller is configured to obtain a time constant of the temperature change of the substrate support from the temperature change of the substrate support measured by the measurer and to acquire a thermal resistance corresponding to the obtained time constant with reference to the memory,
   wherein the memory is configured to store a correspondence between the thermal resistance and the time constant, which is obtained in advance, as thermal resistance data, and
   wherein the controller is configured to acquire the thermal resistance by reading the thermal resistance corresponding to the obtained time constant from the thermal resistance data stored in the memory.

2. The apparatus of claim 1, further comprising an adjuster configured to adjust the temperature of the substrate support or the thermal resistance between the substrate and the substrate support based on a time-dependent change of the thermal resistance acquired by the controller every predetermined cycle.

3. The apparatus of claim 1, wherein the controller is configured to acquire the thermal resistance by fitting the temperature change of the substrate support measured by the measurer to a relational expression relating to heat transfer of the substrate support in which the thermal resistance between the substrate and the substrate support is used as a parameter.

4. The apparatus of claim 1, wherein the substrate support does not include a heater.

5. A plasma processing apparatus, comprising:
   a substrate support on which a substrate is supported;
   a detector configured to detect a temperature of the substrate support;
   a measurer configured to measure, by the detector, a temperature change of the substrate support at a predetermined cycle while the temperature of substrate support is increasing after igniting plasma or while the temperature of the substrate support is decreasing after the plasma processing is completed and the plasma is extinguished, based on the temperature of the substrate support detected by the detector;
   a memory configured to store a thermal resistance between the substrate and the substrate support for each time constant of the temperature change of the substrate support; and
   a controller that executes a control program stored in the memory to control an overall operation of the plasma processing apparatus,
   wherein the controller is configured to calculate the thermal resistance between the substrate and the substrate support based on the temperature change of the substrate support measured by the measurer,
   wherein the controller is configured to obtain a time constant of the temperature change of the substrate support from the temperature change of the substrate support measured by the measurer and to acquire a thermal resistance corresponding to the obtained time constant with reference to the memory,
   wherein the substrate support has a configuration in which an electrostatic chuck for electrostatically attracting the substrate and a base are stacked one above the other and bonded by an adhesive layer,
   wherein the detector is provided on the electrostatic chuck and the base,
   wherein the measurer is configured to measure, by the detector, temperature changes of the electrostatic chuck and the base while the temperature of the substrate support is increasing after igniting the plasma or while the temperature of the substrate support is decreasing after the plasma processing is completed and the plasma is extinguished,
   wherein the memory is configured to store a thermal resistance of the adhesive layer and a thermal resistance between the substrate and the substrate support for each combination of time constants of the temperature changes of the electrostatic chuck and the base,
   wherein the controller is configured to obtain the time constants of the temperature changes of the electrostatic chuck and the base from the temperature changes of the electrostatic chuck and the base measured by the measurer, and acquire the thermal resistance of the adhesive layer and the thermal resistance between the substrate and the substrate support corresponding to a combination of the obtained time constants of the temperature changes of the electrostatic chuck and the base with reference to the memory,
   wherein the memory is configured to store a correspondence between the thermal resistance of the adhesive layer and the time constant, which is obtained in advance, as thermal resistance data, and wherein the controller is configured to acquire the thermal resistance by reading the thermal resistance corresponding to the obtained time constant from the thermal resistance data stored in the memory.

6. The apparatus of claim 5, wherein the measurer is configured to measure, by the detector, temperature changes of the electrostatic chuck and the base while the temperature of the substrate support is increasing after igniting the plasma or while the temperature of the substrate support is decreasing after the plasma processing is completed and the plasma is extinguished, and the controller is configured to acquire the thermal resistance of the adhesive layer and the thermal resistance between the substrate and the substrate support by fitting the temperature changes of the electrostatic chuck and the base measured by the measurer to a relational expression relating to heat transfer of the substrate support in which the thermal resistance of the adhesive layer and the thermal resistance between the substrate and the substrate support are used as parameters.

7. The apparatus of claim 5, wherein the substrate support does not include a heater.

\* \* \* \* \*